United States Patent [19]
Yamagishi et al.

[11] Patent Number: 5,231,440
[45] Date of Patent: Jul. 27, 1993

[54] METHOD OF AND APPARATUS FOR FORMING VOLUME TYPE PHASE HOLOGRAM

[75] Inventors: Yasuo Yamagishi, Zama; Takeshi Ishitsuka, Isehara; Motoaki Tani; Youko Kuramitsu, both of Atsugi, all of Japan

[73] Assignee: Fujitsu Limited, Kawasaki, Japan

[21] Appl. No.: 906,354

[22] Filed: Jun. 30, 1992

Related U.S. Application Data

[62] Division of Ser. No. 416,943, Oct. 4, 1989, Pat. No. 5,154,994.

[30] Foreign Application Priority Data

| Oct. 6, 1988 [JP] | Japan | 63-252501 |
|---|---|---|
| Jan. 9, 1989 [JP] | Japan | 1-002203 |
| Jul. 19, 1989 [JP] | Japan | 1-184742 |

[51] Int. Cl.⁵ .......................... G03D 13/08
[52] U.S. Cl. ........................ 354/320; 430/320
[58] Field of Search .............. 354/299, 319–321, 354/324

[56] References Cited

U.S. PATENT DOCUMENTS

| 4,172,724 | 10/1979 | Matsumoto et al. | 430/1 |
|---|---|---|---|
| 4,173,474 | 11/1979 | Tanaka et al. | 430/1 |
| 4,201,441 | 5/1980 | Matsumoto et al. | 430/2 X |
| 4,258,111 | 3/1981 | Matsumoto et al. | 430/2 |
| 4,287,277 | 9/1981 | Matsumoto et al. | 430/2 |
| 4,769,300 | 9/1988 | Butcher | 430/2 |

*Primary Examiner*—D. Rutledge
*Attorney, Agent, or Firm*—Staas & Halsey

[57] ABSTRACT

A method of and apparatus for forming a volume type phase hologram comprising the steps of, after exposure of a holographic material comprising a polymeric matrix having a radiation active substance associated therewith to an interference pattern of radiation, dipping the pattern-wise exposed holographic material in a swelling solution consisting of a first solvent which can act as a good solvent for the polymer of the matrix and a second solvent which can act as a poor solvent for the polymer and has a higher boiling point than that of the first solvent, and then pulling the swollen holographic material up from the swelling solution, whereby uniformly developed holograms having a large size and high qualities can be easily produced by a simple production process.

6 Claims, 6 Drawing Sheets

Fig. 1

PRIOR ART

METHOD OF AND APPARATUS FOR FORMING VOLUME TYPE PHASE HOLOGRAM

This application is a division of application Ser. No. 07/416,943, filed Oct. 4, 1989, U.S. Pat. No. 5,154,994.

BACKGROUND OF THE INVENTION

1. Field of the Invention

The present invention relates to a method of forming a volume type phase hologram. More particularly, the present invention relates to a method of stably forming a uniformly developed volume type phase hologram having an increased diffraction efficiency over a large area by using a monobath or single step development process in which a mixture of a good solvent with a lower boiling point and a poor solvent with a higher boiling point is utilized. The method of the present invention can be used in the production of recording materials, optical elements and other devices.

The present invention also relates to an apparatus for forming a volume type phase hologram, particularly a developing apparatus thereof.

2. Description of the Related Art

As is well known in the art, holography is photographic process and according to this process in which a subject to be recorded is irradiated with a good coherent radiation such as a laser beam, the radiation amplitude and phase is modulated according to the shape of the subject, and then interference fringes of radiation reflected on or transmitted through the subject is recorded in a holographic material to form a hologram producing an optical image of the subject. Further, the optical image can be reproduced by again irradiating the hologram with the radiation. Recently, hologram have been utilized in the production of high-function and compact optical elements (HOE; Holographic Optical Element), because various functions of the optical element can be concentrated in a thin layer of the hologram, in addition to the utilization of holograms as a recording material. Typical examples of the optical elements include a reading system for bar code readers and a laser scanning system for laser printers.

Figure 1:
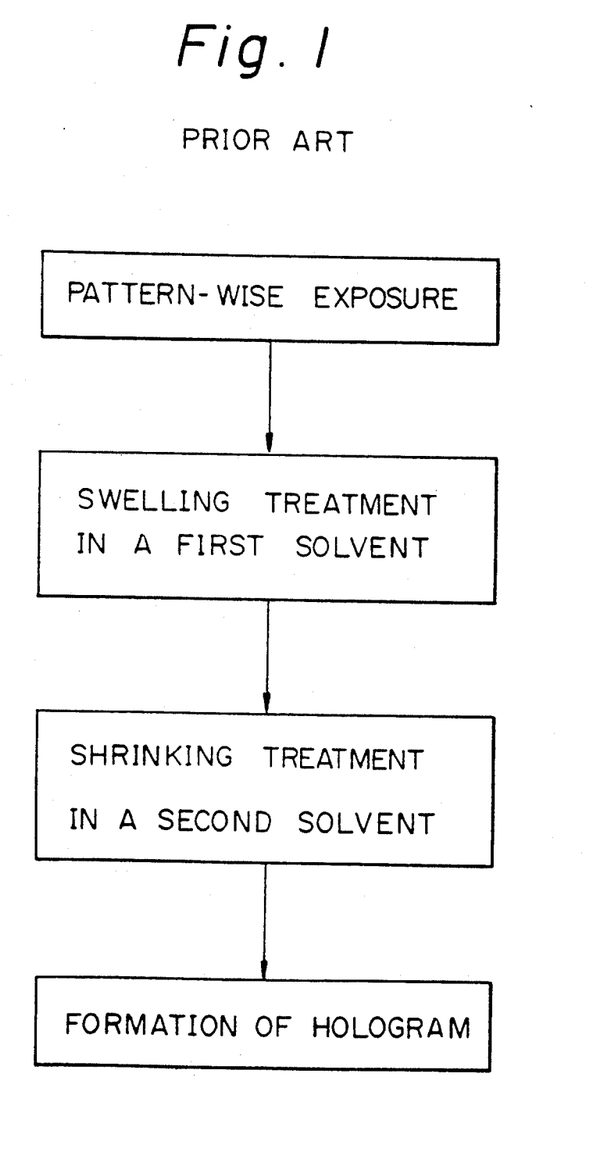
FIG. 1 is a flow diagram of the formation of the hologram according to the prior art two-step development process.

Hitherto, the formation of the hologram has been carried out in a two-step development process. Namely, as illustrated in FIG. 1, the prior art formation of the hologram comprises the steps of:

exposing a holographic material to an interference pattern of radiation, swelling the pattern-wise exposed holographic material in a first solvent as a swelling solution, and shrinking the swollen holographic material in a second solvent as a shrinking solution. The thus obtained hologram has excellent properties such as a high diffraction efficiency and good stability. The two-step development process and the formation of the hologram using this process can be found in many patent disclosures, for example:

(1) Japanese Unexamined Patent Publication (Kokai) No. 53-15152, published on Feb. 10, 1989, and the corresponding U.S. Pat. No. 4,173,474;

(2) Japanese Unexamined Patent Publication (Kokai) No. 53-15153, published on Feb. 10, 1989, and the corresponding U.S. Pat. No. 4,172,724, U.S. Pat. No. 4,258,111 and U.S. Pat. No. 4,287,277;

(3) Japanese Unexamined Patent Publication (Kokai) No. 54-101343, published on Aug. 9, 1979, and the corresponding U.S. Pat. No. 4,201,441;

(4) Japanese Unexamined Patent Publication (Kokai) No. 54-102140, published on Aug. 11, 1979, and the corresponding U.S. Pat. No. 4,201,441;

(5) Japanese Unexamined Patent Publication (Kokai) No. 63-254485, published on Oct. 21, 1988; and (6) Japanese Unexamined Patent Publication (Kokai) No. 63-266478, published on Nov. 2, 1988. Note, among these patent publications, the publications (5) and (6) above were published in Japan after the filing date of Japanese Patent Application No. 63-252501, filed on Oct. 6, 1989, which is a basic application of the present application.

Among the above publications, for example, Japanese Kokai No. 53-15153 concerns a hologram produced by causing a crosslinking reaction in accordance with an interference pattern in a recording carrier composed of a water-insoluble polymer containing in the unit structure thereof an aromatic or heterocyclic ring having a reactive site which can be replaced by a radical, and a halogen-containing compound. The water-insoluble polymer is preferably polyvinyl carbazole, and the halogen-containing compound is preferably a polyhalogen compound. Using this recording carrier, the hologram can be formed as follows: After exposure of the recording carrier to an interference pattern of radiation, the exposed recording carrier is first dipped in a first solvent having a swellability, i.e., a swelling solution to cause the carrier to swell and at the same time, to remove unreacted halogen-containing compound from the carrier. The swelling of the carrier, which corresponds to the latent hologram pattern formed in the previous exposure step, occurs throughout the overall thickness of the carrier. After completion of the swelling treatment, the swollen recording carrier is removed from the swelling solution, and then dipped in a second solvent which is a poor solvent for the recording carrier and is compatible with the first solvent, i.e., a shrinking solution. When the carrier is immersed in the shrinking solution, shrinkage of the carrier immediately occurs as a result of replacement of the first solvent with the second solvent, and thus a differential refractive index between the exposed and unexposed areas or a distribution of the refractive index is produced in a carrier. This distribution of the refraction index relies upon the formation of microporous voids caused by a separation of the solvents during the solvent substitution. Compared with the weakly exposed areas, the strongly exposed areas will produce less voids because of they are difficult to swell, and thus show a relatively increased refractive index. Upon completion of these swelling and shrinking steps, the hologram is fixedly produced in accordance with the swollen state of the carrier.

The two-step development processes described in Japanese Kokai No. 53-15153 and the related literatures listed above have problems in common. Namely, the problem caused by swelling solution remaining on the swollen carrier, just before the shrinking treatment. The inventors found that the amount of remaining swelling solution can have a remarkable effect on the optical properties of the resultant hologram, in addition to the degree of the swelling of the carrier and dissolution of the water-insoluble polymer from the carrier in the swelling solution. More particularly, if the amount of the swelling solution adhered to the carrier surface is unacceptably high, excess amounts of the swelling solution remain as droplets, which will remain as traces in the resultant hologram. Further, if lesser amounts of the swelling solution are used, a desired diffraction efficiency cannot be obtained due to the reduced swelling level and subsequent weak development.

Another problem is that of the time lag from the end of the swelling treatment to the start of the shrinking treatment. The inventors found that the swollen recording carrier, after removal from the swelling solution and before immersion in the shrinking solution, can be adversely affected by atmospheric conditions such as wind and temperature, i.e., the vaporization of the adhered swelling solution can occur, and accordingly the resultant holograms do not have uniform properties.

A third problem is that of the differential exposure of the pulling swollen carrier to the atmosphere. The inventors found that, when the swollen carrier is vertically pulled up from the swelling solution, a notable differential exposure of the carrier to the atmosphere occurs due to of the lengths of the carrier. Apparently, an upper portion of the pulling carrier is exposed to the atmosphere for a relatively long time, compared with the time of exposure of a lower portion of the carrier, and due to this longer exposure time, the development of the upper portion is weaker than that of the lower portion. The problem of the differences of the development strength is more severe for a recording carrier in which polystyrene or polyvinyl carbazole is used as a matrix polymer, in comparison with a recording carrier in which polyvinyl alcohol or polyvinyl pyrrolidone is used as the matrix polymer. This is because the former requires use of the volatile organic solvents as the good solvent, and the latter requires use of the substantially non-volatilizable solvents such as water, as the good solvent. Further, although such longitudinal differences of the development strength are negligible for small-sized holograms, they are particularly remarkable and serious when large-sized holograms are produced. It should be noted that, with regard to this third problem, although the value of the differences may be more or less varied, it essentially occurs in the two-step development process in which the recording carrier is removed from the developer in the course of the development and exposed to the atmosphere such as air or nitrogen gas, and is immersed again in the same or in a different developer to complete the development process. Therefore, to produce large-size and uniform holograms, there is a need for an improved development process in which the above problems are eliminated.

SUMMARY OF THE INVENTION

Therefore, an object of the present invention is to provide a method of forming a volume type phase hologram in which a two-step development step is not used, and which can be applied to the production of a large area and uniform hologram, and can be stably carried out by using a simplified process.

Another object of the present invention is to provide an apparatus for carrying out the above method of forming of the volume type phase hologram, especially a developing apparatus thereof.

The inventors found that these objects can be satisfactorily realized if a holographic material comprising a polymeric matrix having a radiation active substance associated therewith is used as a recording carrier, and a single step development process is used in stead of the prior art two-step development process. The single step development process of the present invention is based on the use of a specific swelling solution which consists of a fast vaporizable solvent and a slowly vaporizable solvent as a developing solution, and a slow and constant pulling up of the swollen holographic material from the swelling solution. The term "associated herewith" used herein is intended to mean that the polymer of the matrix and the radiation active substance can be used in any desired combinations thereof. For example, the polymer and radiation active substance may be dissolved in a solvent to prepare a coating solution, or the radiation active substance may be dispersed in the polymer to prepare a radiation-sensitive solution. Also, the term "pulling up" used herein is intended to mean that the swollen holographic material may be withdrawn from the swelling solution by using any applicable methods including pulling up.

In one aspect of the present invention, there is provided a method of forming a volume type phase hologram comprising the steps of:

exposing a holographic material comprising a polymeric matrix having a radiation active substance associated therewith to an interference pattern of radiation to form a latent image of a hologram; and developing said latent image in a single step process by dipping the pattern-wise exposed holographic material in a swelling solution consisting of a first solvent which can act as a good solvent for the polymer of said matrix and a second solvent which can act as a poor solvent for said polymer and has a higher boiling point than that of said first solvent, and; pulling the swollen holographic material up from said swelling solution to thereby form the hologram as a result of a sequential vaporization of solvents from the holographic material.

In another aspect of the present invention, there is provided an apparatus for forming a volume type phase hologram, which apparatus is provided with a developing apparatus comprising:

a developing chamber with a closed wall, a container for a swelling solution disposed in a bottom wall of said chamber, a means for maintaining said swelling solution at a predetermined and constant temperature, a means for fixing an exposed holographic material to be developed, and a guide means for said holographic material by which said material can be dipped in said swelling solution and then pulled up from said swelling solution at a predetermined speed, said guide means having a fixing mean attached thereto.

DESCRIPTION OF THE PREFERRED EMBODIMENTS

Figure 2:
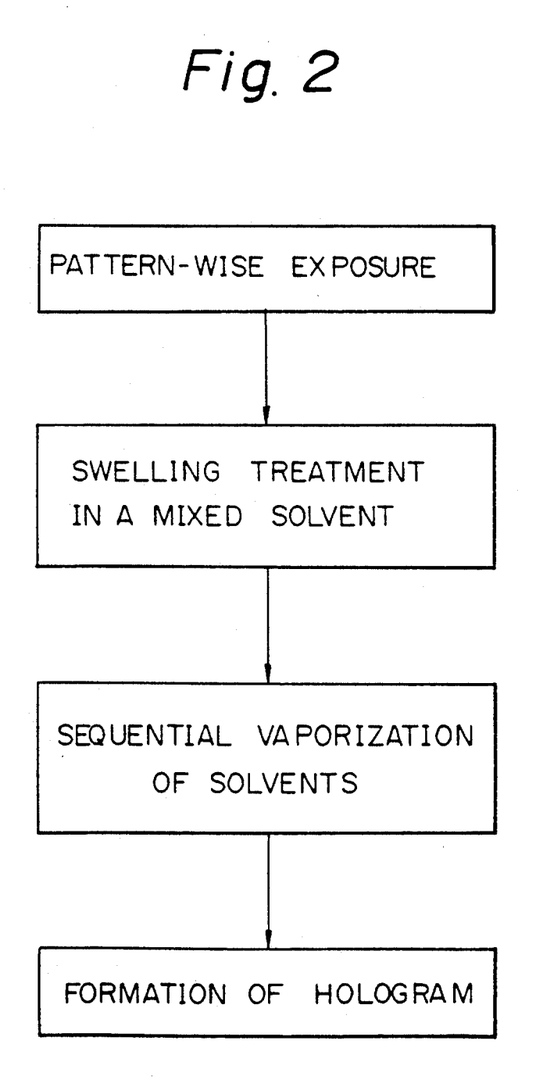
FIG. 2 is a flow diagram of the formation of the hologram according to the method of the present invention.

The formation of the hologram according to the present invention is characterized by a single step development process using as a developer a swelling solution consisting of a low-boiling good solvent and a high-boiling poor solvent. The single step development process, as illustrated in FIG. 2, comprises the steps of: (1) a pattern-wise exposure of the holographic material, (2) a swelling treatment of the exposed material with a mixed solvent or swelling solution, (3) a sequential vaporization of the solvents from the swollen material, and (4) a formation of the hologram.

As a first stage of the hologram formation, the pattern-wise exposure is made by exposing a holographic material to an interference pattern of radiation. The radiation used in this exposure is preferably a laser beam, but other radiation sources conventionally used in the holographic process such as a mercury vapor lamp or xenon lamp may be used as desired. The strength of the pattern-wise exposure may be widely varied depending upon the desired results and other factors. The type of exposure device is not limited, but preferably a conventional two-beam interference exposure device is used. When forming a latent image of hologram in the exposed holographic material.

Next, the latent image in the holographic material is developed by subjecting the material to a swelling treatment in a mixed solvent or a swelling solution. The swelling solution is a mixture of two types of solvents, i.e., a low-boiling solvent which is a good solvent for the polymer as a matrix of the holographic material such as polyvinyl carbazole, and a high-boiling solvent which is a poor solvent for that polymer. As a result of this treatment, the holographic material is swollen, and the extent of swelling can be controlled by selecting the types of the above solvents, and changing the mixing ratio of the solvents.

After the swelling treatment is completed, the swollen holographic material is slowly pulled up from the swelling solution to cause a sequential vaporization of the solvents, i.e., the complete the development. The first solvent is initially vaporized, because it has a lower boiling point than that of the second solvent, and thus only the second solvent remains as the retained swelling solution in the holographic material. An increased concentration of the second solvent means that the matrix polymer is substantially not dissolved in the retained swelling solution and therefore, it separates out from said swelling solution. Following these steps, the second solvent is finally vaporized, and voids having distribution which corresponds to a pattern of the exposure radiation are formed. These voids ensure the formation of the intended hologram.

Although not shown in FIG. 2, after the pattern-wise exposure and before the swelling treatment, the exposed holographic material is preferably discolored to remove adverse constitutional components such as a reaction initiator or sensitizer. This treatment effectively to stabilize the development process and prevent the formation of cracks.

In the practice of the present invention, the holographic material can be selected from a plurality of well-known holographic materials, for example, those used in the prior art two-step development process. Further, a combination of the polymeric matrix and radiation active substance can be widely varied, depending on the desired hologram and other factors.

In a preferred embodiment of the present invention, the polymer of the polymeric matrix contains a carbazole ring in a recurring unit thereof, and the radiation active substance used in association with the polymer is a reaction initiator which can modify a solubility of the polymer in solvents upon exposure to radiation. The inventors found that a satisfactorily increased diffraction efficiency can be obtained especially when a holographic material based on the carbazole ring-containing polymer is used.

The carbazole ring-containing polymer used in the present invention includes polyvinyl carbazole, vinyl carbazole-styrene copolymer, vinyl carbazole-vinylidene chloride copolymer, vinyl carbazole-acrylate copolymer, vinyl carbazole-vinyl pyridine copolymer, halogen-substituted polyvinyl carbazole, nitrated polyvinyl carbazole, and related polymers and copolymers. These polymers have a molecular weight of at least 100,000 or more, preferably 500,000 or more. Further, these polymers may be used alone or in combination.

If desired, the carbazole ring-containing polymer may contain one or more additional polymers, to improve the qualities of the resulting coating or layer.

Further, since the carbazole ring-containing polymer generally has little or no sensitivity to a laser beam, it is necessary to add a reaction initiator, a sensitizing dye and other additives to the polymer. Suitable reaction initiators include, for example, polyiodide compounds such as iodoform or carbon tetraiodide, organic peroxide compounds such as 1,1',4,4'-tetra(tert-butylperoxycarbonyl) benzophenone or tert-butylperoxyacetate, and basic dyes such as thioflavine T or crystal violet. Furthermore, when a visible radiation is used as an exposure source or a pattern of the visible radiation is recorded in the holographic material, it is necessary to use a sensitizing dye in combination with the reaction initiator. A suitable sensitizing dye for the polyiodide compounds is a polycyclic aromatic compound such as tetraphenylnaphthacene, and a suitable sensitizing dye for the organic peroxide compounds is a thiopyrrium salt or a coumarin dye.

In another preferred embodiment of the present invention, the holographic material comprises a polymeric matrix having a photopolymerizable substance which can act as the radiation active substance, dispersed therein.

The kind of polymer of the polymeric matrix is not restricted, as being as it satisfies the requirements of the hologram formation of the present invention. Suitable matrix polymers include, for example, naturally occurring polymeric materials such as gelatine, casein or starch, cellulose derivatives such as cellulose acetate or carboxymethylcellulose, semi-synthetic polymeric materials such as plastic materials, synthetic polymeric materials such as polyisobutylene, polystyrene, terpene resin, polyacrylate, polyacrylic ester, polymethacrylic ester, polyacrylonitrile, polyacrylamide, polyvinyl acetate, polyvinyl alcohol, polyvinyl pyrrolidone, polyacetal resin, polyvinyl pryidine, polyvinyl carbazole, polybutadiene, polyoxymethylene, polyethyleneimine, amino resin, alkyd resin, polycarbonate resin, unsaturated polyester resin, allyl resin or epoxy resin, and natural rubbers such as chlorinated rubber or cyclized rubber. These matrix polymers preferably have an increased molecular weight, because it is essential to the present invention that the matrix polymers is swollen in the swelling solution used as a developer in the subsequent development step, without being dissolved, i.e., infinite swelling, in the solution. Note, it will be appreciated that most of the above-listed matrix polymers are water-insoluble polymers which could not be used in the prior art holographic methods, especially those methods based on the two-step development process.

The photopolymerizable substance to be dispersed in the polymeric matrix preferably comprises an ethylenically unsaturated bond-containing compound, especially as a monomer, a polymerization initiator, and optionally, a photosensitizing dye.

The ethylenically unsaturated bond-containing compounds useful in the holographic material of the present invention include, for example, acetoxymethylvinylketone, phenylvinylketone, divinylketone, maleimide, N-ethylmaleimide, N-3-acetoxypropylmaleimide, N-methylolacrylamide, N,N-methylenebisacrylamide, methyl acrylate, pentaerythritol triacrylate, tris(acryloyloxyethyl)isocyanurate, triethyleneglycol dimethacrylate, dimethyleneglycol dimethacrylate and methyl methacrylate.

Further, useful polymerization initiators include, for example, ketones such as benzophenone or ethoxyacetophenone, organic peroxide compounds such as 3,3',4,4'-tetra(t-butylperoxycarbonyl)benzophenone (BTTB), di-t-butyldiperoxyisophthalate, 2,2-bis(t-butylperoxy)butane, 2,5-dimethyl-2,5-di(t-butylperoxy)hexane, t-butylhydroperoxide or methylethylketone peroxide, polyhalogen compounds such as iodoform, carbon tetraiodide or carbon tetrabromide, azo compounds such as azoxystyrene or azobisisobutylonitrile, alleneferric complexes, chloromethyltriazine, phenylglycine, and the like.

Furthermore, the photosensitizing dye used in combination with the matrix polymer and ethylenically unsaturated bond-containing compound can be optionally selected from well-known sensitizing dyes, taking an emission spectrum of the exposure source such as a laser into consideration. Suitable sensitizing dyes include, for example, a coumarin dye, a ketocoumarine dye, a thioxanthene dye, a thiopyrrium dye, a basic dye such as crystal violet or thioflavine T, a thioflavane compound, and a condensed, polycyclic aromatic compound such as tetraphenylnaphthacene.

Since the combination of the matrix polymer with the ethylenically unsaturated bond-containing compound and sensitizing dye is described in detail in, for example, "Synthesis and Application of Photofunctional Polymers", CMC, R&D Report No. 56, p88-96, these references should be referred to in the practice of the present invention. The combination may be adjusted so that a difference of the solubility of the matrix polymer in the swelling solution or developer from that of the photopolymerizate in the same solution is further increased. This is because sometimes a satisfactory development cannot be obtained, even though the photopolymerizable substance is uniformly dispersed in the matrix polymer and a photopolymerization reaction occurs in the resulting uniform dispersion system. Of course, two or more matrix polymers may be used in combination, if desired. Note, all of the constitutional components of the holographic material according to the present invention may be used alone or in combination.

The holographic material of the present invention can be prepared, for example, by uniformly mixing the constitutional components thereof, such as the matrix polymer, photopolymerizable substance, and initiator, dissolving the mixture in a suitable solvent, and coating the resultant solution onto a substrate by using a conventional coater such as a dip coater, spin coater, roll coater or bar coater. This coating process should be carried out with care, to ensure that the resulting coating has a flat and uniform surface.

The holographic material thus prepared is then exposed to an interference pattern of radiation to form a latent image of a hologram. The exposure is preferably carried out with a laser beam in a two-beam interference exposure device. Of course, other conventional exposure methods and other exposure radiations may be used if desired. When the holographic material comprises a combination of the polymeric matrix and the photopolymerizable substance, as a result of this pattern-wise exposure, a photopolymerizate is produced in an exposed area of the holographic material, and an unreacted photopolymerizable substance remains in an unexposed area thereof due to the absence of a photopolymerization thereof. Eventually, a latent image corresponding to the interference pattern of the exposure radiation, i.e., a hologram latent image, is formed in the exposed holographic material.

After completion of the pattern-wise exposure, the exposed holographic material is developed to change the latent image to a corresponding visible image. Note, after exposure and before development, the exposed holographic is discolored with a solvent to remove adverse constitutional components therefrom. These adverse components are, for example, unreacted monomers, reaction or polymerization initiators, sensitizers such as dyes, and the like. Preferably, these components are removed in the pre-development treatment, as this will stabilize and improve the qualities of the holographic layer or coating, namely, prevent drawbacks such as clouding to white, formation of cracks and separation of the holographic layer from the substrate. In the embodiment of the present invention in which a polymeric matrix is used in association with a photopolymerizable substance, although the unreacted photopolymerizable substance can be dissolved out in a solvent used as a swelling agent in the development process, the solvent system suitable for the removal of the photopolymerizable substance is different from that suitable for the development. It is preferrable to separately carry out the discoloration process and the development process, to provide a greater freedom of selection of a solvent for use as the swelling agent, since the limitation of the evaporation power in addition to the solubility is applied to the swelling solvent in the practice of the present invention.

Following the exposure and/or pre-development process, as previously described, the exposed holographic material is developed with a mixed solution of low-boiling good solvent and high-boiling poor solvent in a single step process. The mixed solution is particularly referred to herein as a "swelling solution". The mixed solution used as the swelling solution may have widely varied compositions and mixing ratios depending upon the specific constitutional components used, specific holograms desired and other factors.

In the embodiment of the present invention, in which the carbazole ring-containing polymer is used in association with the reaction initiator, preferably dichloromethane, chloroform, carbon tetrachloride, 1,2-dichloroethane, 1,2-dichloroethylene, thrichloroethylene, benzene, tetrahydrofuran or tetrahydropyrane is used as the low-boiling good solvent or first solvent.

These solvents may be used alone or in combination. Also, preferably a paraffin hydrocarbon such as heptane, octane, nonane or decane, or an alcohol such as butanol or propanol is used as the high-boiling poor solvent or second solvent. These second solvents may be used alone or in combination.

Moreover, in view of the principle of the present invention, any resin not compatible with the carbazole ring-containing polymer but having a very different refractive index to that of the polymer, for example, an acrylate resin such as glycerol monomethacrylate may be used in stead of the second solvent. In this instance, although the resin used instead of the second solvent may remain in voids of the swollen polymer, it does not advesely affect the creation of a differential refractive index sufficient to produce holograms because of the large difference of the refractive index thereof as described above. Namely, a distribution of the resin filled in the voids can contribute to the creation of the differential refractive index.

As described above, the swelling solution or developer is basically constituted by the mixed solution of the low-boiling good solvent and high-boiling poor solvent, but if desired, any low-boiling poor solvent such as pentane may be added to the developer, to control a swelling property of the entire developer to the polymer, or any solvent having a relatively higher boiling point and good swellability such as xylene may be added to the developer, to inhibit the formation of voids.

In addition to the above-described embodiment, the same or different swelling solutions may be used in another embodiment of the present invention, in which the polymeric matrix is used in association with the photopolymerizable substance.

Namely, in the system wherein water-insoluble polymers such as polystyrene, polycarbonate or polyvinyl carbazole are used as the matrix polymer, a selection of good solvents or first solvents for the polymers can be made over a relatively wide range. Low-boiling solvents having a high solubility to a plurality of resins such as dichloromethane, dichloroethane, chloroform or tetrahydrofuran may be used. Especially, dichloromethane is a suitable solvent for the object of the present invention, because it has a high solubility, is low-boiling, is not inflammable and has a relatively low toxicity. Further, any solvents such as alcohols, ketones, esters and the like may be used as the poor solvents for the polymer. Especially, paraffin hydrocarbons having a large number of carbon atoms are suitable, because the carbon number thereof can be freely changed in accordance with the boiling point of the good solvent used.

On the other hand, in the system wherein water-soluble polymers such as polyvinyl alcohol or polyvinyl pyrrolidone are used as the matrix polymer, it is necessary to use water as the good solvent for the polymers, since there are no low-boiling organic solvent suitable as the good solvent commercially available. Since water is difficult to vaporize due to its high boiling point and high evaporation energy, the selection of poor solvents for the polymers is restricted to a narrow range. Namely, since the poor solvents must be those which can be freely mixed with water but are not easily vaporized compared with water, the isopropyl alcohol used as the poor solvent in the prior art two-step development process can not be used in the present invention. Suitable poor solvents for the polymers include, for example, N-methylformamide, N,N-dimethylacetoamide, N-methylpyrrolidone and the like. Further, a specific means can be used to obtain a rapid vaporization of water during the development. For example, the development can be accelerated if a temperature of the developer used is increased and a hot air is applied to the developed holographic material immediately after pulling up same from the developer.

Immediately after completion of the swelling treatment in a single step process, the swollen holographic material is pulled up or withdrawn from the developer to evaporate substantially all of the solvents in the swollen material through a vaporization of the solvents. The vaporization of the solvents can be carried out only by pulling up the swollen material from the developer under the suitably controlled pulling speed conditions. Preferably, the swollen material is pulled up from the developer at a slower speed such that the first solvent is initially vaporized, the matrix polymer separates out from the second solvent as a result of increase of concentration of the second solvent, and finally the second solvent is vaporized. The inventors found that the swollen holographic material should be continuously pulled up from the developer, preferably at a constant pull speed. Although the pull speed can be widely varied, depending upon various factors, the inventors found that the pulling speed is preferably about 0.1 to 100 mm/sec, more preferably about 1 to 10 mm/sec, most preferably about 1 to 3 mm/sec. To improve this vaporization of the solvents, an additional acceleration means such as an application of hot air, as previously described, may be used in the pulling up operation. Moreover, the pulled up holographic material can be protected from the adverse influence of the surrounding atmosphere. This is because the inventors also found that the environmental conditions for the pulling holographic material such as a flow of air or other gases attacking the material, or a concentration of the surrounding vapor, can have a remarkable affect on the optical properties of the resulting hologram and the state of the hologram layer or coating.

According to the present invention, the series of the pattern-wise exposure, swelling and sequential vaporization steps result in an excellent hologram in the form of voids in the holographic material, a distribution of the voids corresponding to a pattern of the interference radiation used in the exposure step. Surprisingly, according to the present invention, a uniform hologram having a high diffraction efficiency over a large hologram area can be stably and easily produced because of the use of a single step development, without a lowering of the excellent optical properties and resistance to the environment. Moreover, according to the present invention, it is possible to use water-insoluble polymers as the matrix polymer with satisfactory results. Note, the use of water-insoluble polymers was avoided in the prior art, as previously described.

The mechanism of the formation of the hologram according to the present invention will be described hereinafter with reference to FIGS. 3A to 3D and FIGS. 4A to 4D.

In the formation of the hologram, when the holographic material used comprises a polymer having a photopolymerizable substance dispersed therein, a high diffraction efficiency cannot be obtained even if the unreacted photopolymerizable substance is selectively removed after completion of the exposure. The reason why the high diffraction efficiency cannot be obtained is considered to be that the removal of the unreacted substance is not sufficient to reproduce recesses and projections in the surface of the material, in conformity with a distribution of the removed and remaining substances. As is well-known in the art, a step between the exposed and unexposed areas of the holographic material can be clearly observed, if a relatively wide thin film waveguide with an exposure area width of several 10 μm is produced from the holographic material as in the above-described instance. Nevertheless, such a step, or the recesses and projections, gradually becomes obscure or indistinct with a reduction of the width of the exposure area. No recesses and projections could be observed for holograms having a spatial frequency of about 2000 lines/mm. The reduction of the recesses and projections in the hologram surface is considered to be due to the following factors. When the surface recesses and projections are formed, the surface free energy is increased in accordance with an increase of the surface area. On the other hand, a volume change in a lateral direction accompanies the increase of free energy, and therefore, when the spatial frequency is increased, a volume change in a lateral direction occurs as a result of a large increase of the surface energy due to the formation of the recesses and projections, and thus the surface recesses and projections in the hologram are reduced. The above-explained mechanism of the hologram formation will be described hereinafter with reference to FIGS. 3A to 3D.

Figure 3A:
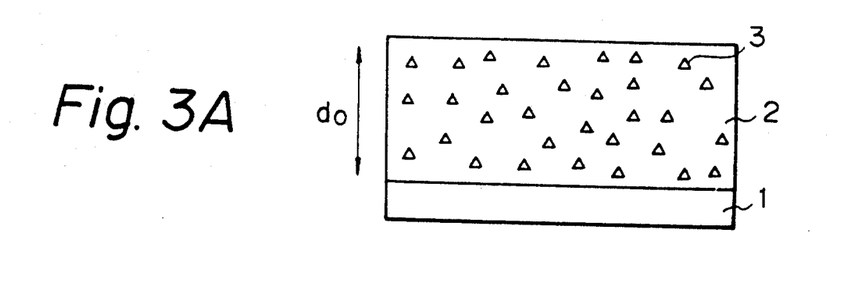
FIGS. 3A to 3D are cross-sectional views showing, in sequence, a mechanism of the formation of the hologram.

In FIG. 3A, a recording carrier or holographic material comprises a substrate 1 such as glass substrate having a holographic layer or photosensitive layer 2 applied thereon. The holographic layer 2 has a thickness of $d_0$ and comprises a polymer having a photopolymerizable substance 3 dispersed therein.

Figure 3B:
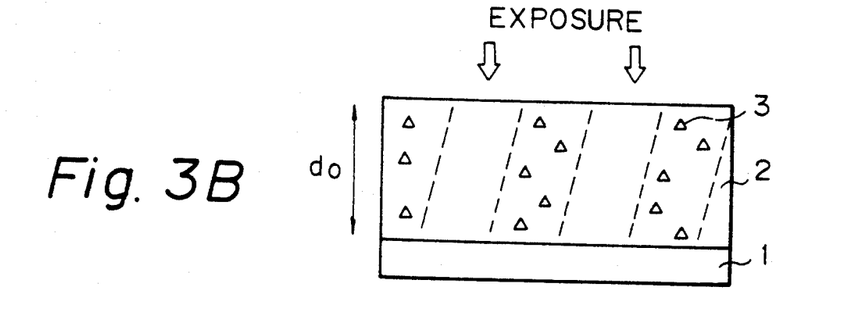

The pattern-wise exposure of the holographic material is carried out as shown in FIG. 3B. Upon the exposure of the holographic material to an interference pattern of the predetermined radiation, as shown in FIG. 3B, a photopolymerizate (not shown) is produced in an exposed area of the holographic layer 2, while the unreacted photopolymerizable substance 3 remains in an unexposed area of the layer 2 because of the absence of photopolymerization thereof.

Figure 3C:
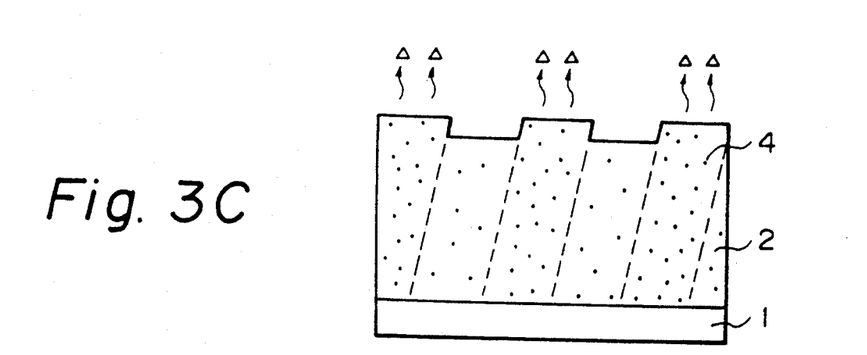

After to the exposure step, the exposed holographic material is treated with a solvent to remove the unreacted photopolymerizable substance from the unexposed area. As shown in FIG. 3C, the removal or solution of the unreacted photopolymerizable substance 3 and swelling of the layer 2 due to intake of a solvent 4 occurs simultaneously in the unexposed area.

Figure 3D:
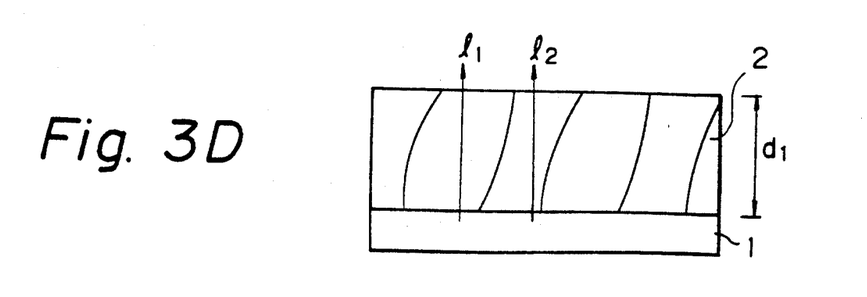

The solvent treatment is followed by drying, and for the reasons described above, and as shown in FIG. 3D, a layer thickness of the holographic layer 2 is reduced to $d_1$ and recesses and projections on the surface of the layer 2 are flattened. As illustrated, the exposed area has an optical path $l_1$, and the unexposed area has an optical path $l_2$. In this illustrated example, assuming that the photopolymerizable substance is completely polymerized, and thus all of the photopolymerizate remains in the exposed area but no polymerization is induced in the unexposed area, and therefore, the photopolymerizable substance can be entirely dissolved out of that area, the following relationship is obtained:

$$\text{optical path difference } (\Delta nd)_1 = l_1 - l_2 = p \cdot d_1 \cdot (n_1 - n_0)$$

in which
 $p$ denotes a concentration of the photopolymerizable substance,
  $n_1$ denotes a refractive index of the substance, and
  $n_0$ denotes a refractive index of the polymer.

In contrast to the formation of the hologram described above with reference to FIGS. 3A to 3D, an increased diffraction efficiency can be obtained if the swelling and shrinking treatments are carried out during the developing process. The reasons for this satisfactory result are based on the following. Namely, the holographic layer can be swollen to a substantially uniform thickness in a good solvent, without the formation of recesses and projections on a surface thereof. When the swollen layer is immersed in a poor solvent, the polymer in the holographic layer can precipitate as a result of the inter substitution of the good and poor solvents, and the polymer is separate from the solvent. Accordingly, microvoids are produced in the holographic layer. More particularly, in this treatment, an increased numbers of voids are formed in the area wherein the unreacted photopolymerizable substance was dissolved out, in comparison with the area wherein the photopolymerizable substance was polymerized and thus the polymerizate was retained, because the formation of the recesses and projections in the surface of the holographic layer is prevented due to the above-described affect of the surface free energy. Since the refractive index of the holographic layer is entirely reduced upon formation of the voids in the layer, a distribution of the refractive index corresponding to the interference fringes or patterns applied is produced, and accordingly, a desired hologram can be obtained in the holographic layer. The above-explained mechanism of the hologram formation will be described hereinafter with reference to FIGS. 4A to 4D.

Figure 4A:
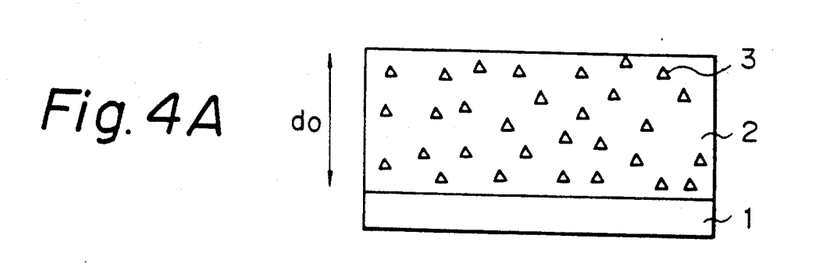
FIGS. 4A to 4D are cross-sectional views showing, in sequence, another mechanism of the formation of the hologram.

FIGS. 4A to 4D correspond to FIGS. 3A to 3D described above, respectively. The constitution and layer arrangement of the holographic material, the exposure conditions and the like is this example are the same as those of FIGS. 3A to 3D. An explanation of FIG. 4A is therefore omitted to avoid duplication.

Figure 4B:
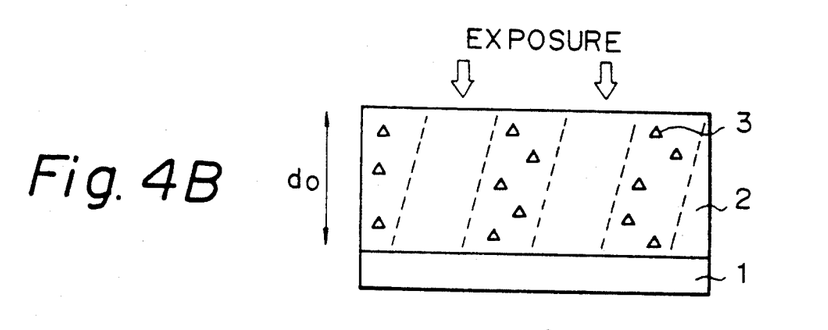
Figure 4C:
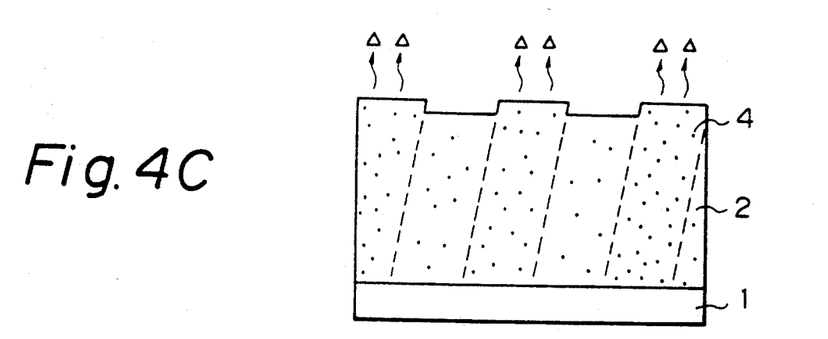
Figure 4D:
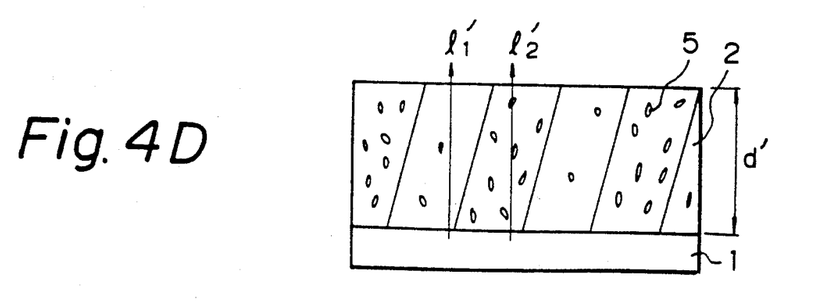

Upon exposure of the holographic material to an interference pattern of radiation, the holographic layer 2 as shown in FIG. 4B is obtained. Following the exposure, the holographic material is swollen with a good solvent, and the swollen holographic layer 2 as shown in FIG. 4C is obtained. The layer 2 is swollen to a substantially uniformly increased thickness, with less topographic features. The swollen holographic material is further treated with a poor solvent as a shrinking solution, and as a result of the solvent substitution, the layer 2 (layer thickness d') having microvoids 5 is obtained as is shown in FIG. 4D. The reason why microvoids are formed in the holographic layer has been explained. Eventually, a hologram corresponding to the applied interference pattern can be obtained, and in this example, assuming that the optical path of the exposed area and that of the unexposed area is $l_1'$ and $l_2''$, respectively, the following relationship is obtained:

$$\text{optical path difference } (\Delta nd)_2 = l_1' - l_2' =$$

$$\{(1 - p)n_0 + pn_1\}d_0 + (d' - d_0) - [\{(1 - p)n_0 + p \times 1\}d_0 +$$

$$(d' - d_0)]$$

$$= pd_0(n_1 - 1)$$

in which $\rho$, $n_1$ and $n_0$ are as defined above.

As will be appreciated, the present invention is an improvement on the former hologram formation process. Namely, the formation of microvoids in the holographic layer according to the present invention can be accomplished with a single development process by using a mixed solution of the low-boiling good solvent and high-boiling poor solvent. More particularly, the pattern-wise exposed holographic layer is swollen with a mixed solution consisting of the first solvent acting as a good solvent for the polymer and the second solvent acting as a poor solvent for the polymer. The extent of the swelling can be varied by controlling the types and mixing ratios of the good and poor solvents, as well as the bath temperatures applied. After the single swelling treatment, the holographic material is slowly pulled up from the mixed solution, and when a low-boiling solvent is used as the good sovlent, the good solvent is first vaporized, and thus the poor solvent remains in the holographic layer. As a result of the increased concentration of the poor solvent, a solubility of the entire solution to the polymer is increased. The polymer precipitates and separates from the poor solvent. The vaporization of the poor solvent occurs during the pulling up of the holographic material, and thus traces of the vaporized poor solvent becomes voids. Note, according to the development process of the present invention, since the hologram can be sequentially developed during the pulling up of the swollen holographic material, an important problem of the prior art process, i.e., differential development strength in a longitudinal direction of the material, is solved.

The formation of the hologram according to the present invention can be carried out by using any conventional apparatus, but as briefly described in the SUMMARY OF THE INVENTION, it is preferably carried out by using a specific developing apparatus comprising (1) a developing chamber, (2) a container for a swelling solution, (3) a temperature controlling means for controlling the temperatures of the swelling solution, (4) a means for fixing the exposed holographic material, and (5) a means for guiding the holographic material.

Preferably, the container for the swelling solution is provided with a jacket through which a heated or cooled water or other medium is circulated to maintain the container and the contents thereof at a desired temperature.

Further, the means of guiding the holographic material preferably comprises a stand having a rack surface, a guide box movable upwardly and downwardly on the rack surface, and an arm mounted on the guide box, an end portion of the arm being connected to the means for fixing the holographic material.

Furthermore, the developing chamber preferably is provided with a gas or air inlet pipe and an exhaust pipe so that a dry atmosphere is created in the chamber, and the container preferably is provided with a barrier wall in an upper end portion thereof so that, at an initial stage of the pulling, the pulled up holographic material is protected from direct exposure to the atmosphere.

Figure 5:
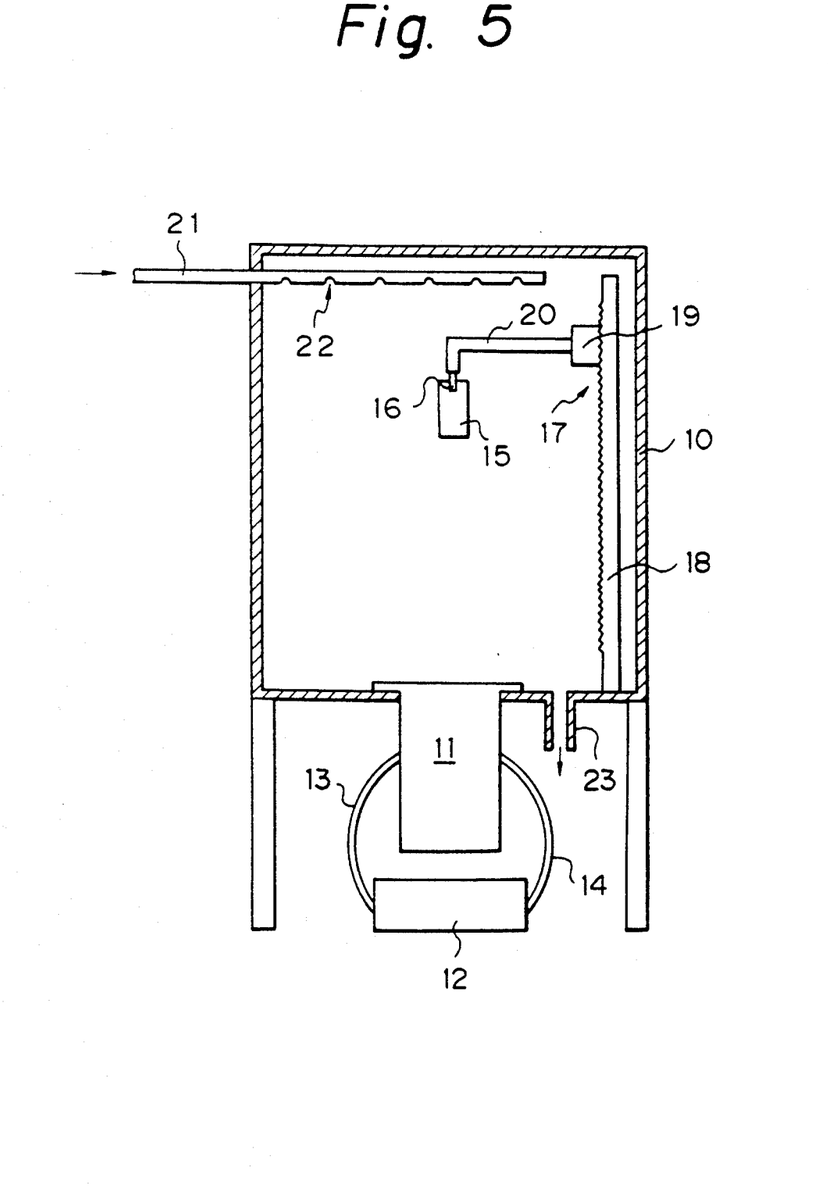
FIG. 5 is a schematic diagram of a developing apparatus used in the practice of the present invention.
Figure 6:
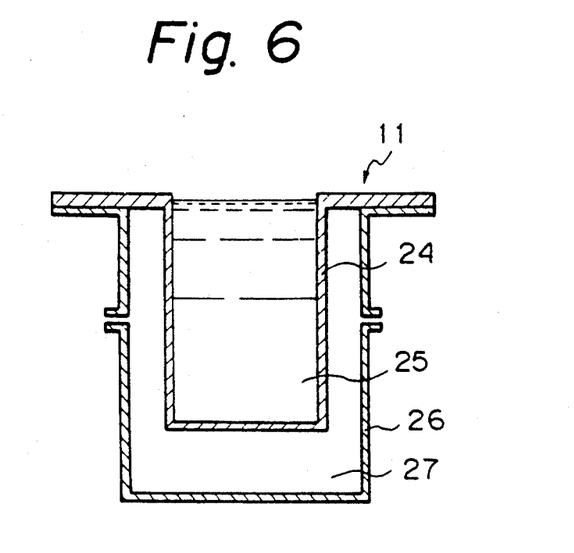
FIG. 6 is a schematic diagram of a developing bath used in the developing apparatus of FIG. 5.
Figure 7:
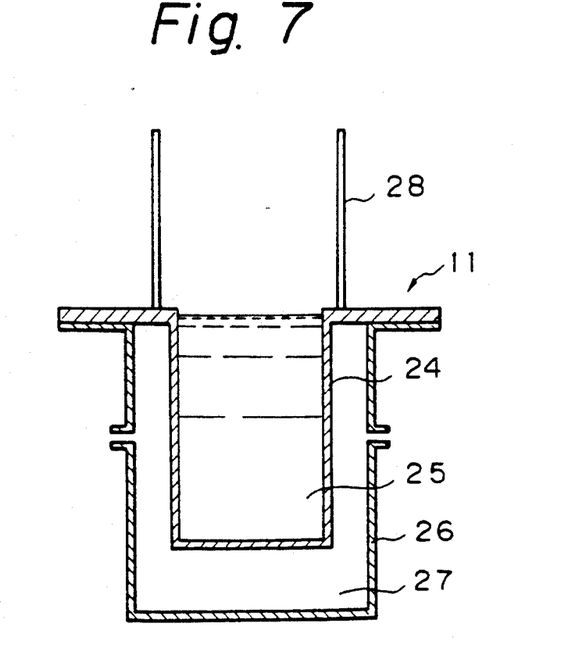
FIG. 7 is a schematic diagram of another developing bath used in the developing apparatus of FIG. 5.

FIGS. 5 to 7 are schematic diagrams of a developing apparatus, and a developing bath thereof, useful in the practice of the present invention.

The developing apparatus of FIG. 5 comprises a developing chamber 10 having a closed wall, and a container 11 for a swelling solution or developing bath is disposed in a bottom portion of the chamber 10. Preferably, the container 11 has a double jacket structure as illustrated in FIG. 6. Namely, as shown in FIG. 6, a developer container 24 for receiving a swelling solution or developer is provided with a jacket 26 through which a solution 27, for example, heated or cooled water, is circulated.

The circulated solution 27 is maintained at a predetermined and constant temperature by a temperature controlling mean 12, and is guided through conduits 13 and 14 (FIG. 5). Accordingly, a swelling solution 25 is retained at a constant temperatures in the container 24 during the development process. If desired, the container 11 may further comprise a barrier wall 28 or cylinder surrounding an upper end portion thereof as shown in FIG. 7. The barrier wall 28 effectively protects the pulling holographic material from direct exposure to the atmosphere such as air or gas, since this atmosphere can cause the many drawbacks previously described.

In the developing apparatus shown in FIG. 5, a holographic material 15 is connected through a fixing means 16 such as holder to a guide means 17. The guide means 17, as is shown in a preferred form in FIG. 5, comprises a stand 18 with a rack surface, a guide box 19 freely movable over said rack surface, and an arm 20 mounted on the guide box 19. An end portion of the arm 20 is provided with the fixing means 16. The design of the guide means 17 may be modified to improve the drive mechanism of the holographic material.

Further, in the shown developing apparatus, a gas or air inlet pipe 21 with spraying holes 22 is provided in an upper portion thereof to introduce a dried nitrogen gas or air into the chamber 10, and an exhaust pipe 23 is disposed in a bottom wall of the chamber 10, whereby a dry atmosphere is created in the chamber. Of course, other gases may be introduced into the chamber to produce the dry atmosphere, if desired.

Using the developing apparatus of FIG. 5, the pattern-wise exposed holographic material 15 can be developed as follows:

The holographic material 15, after pattern-wise exposure to an interference radiation, is mounted through the fixing means 16 on the arm 20 of the guide means 17, and the guide box 19 is moved downward to immerse the holographic material 15 in the swelling solution in the swelling solution in the container 11. The holographic material 15 is immersed in the swelling solution for a time sufficient to cause the material 15 to swell to a predetermined swelling level. Immediately after completion of the swelling treatment, the guide box 19 is slowly elevated at a constant speed. Since the swollen solution, the good and poor solvents contained in the material are sequentially vaporized, and thus a desired hologram is obtained. The mechanism of the hologram formation was previously described.

As will be appreciated, if the described developing apparatus is used in the practice of the present invention, the process of forming of the hologram is further improved. The guide means 19 disposed in the chamber 10 enables the swollen holographic material 15 to be pulled up in a desired manner. Moreover, the barrier wall, if used, can remove excess swelling solution adhered to a surface of the holographic material, just before the start of pulling up of said material, as it can act as a reservoir for temporarily receiving a saturated vapor of the first vaporized good solvent, in addition to acting as a windbreaker. Since the remaining drops of the swelling solution on the surface of the pulled up holographic material 15 can be completely removed, an undesirable uneven development, which could not be avoided in the prior art methods, can be avoided or at least reduced. An additional advantage is that an enlarged scope of the preferred range of the pulling up speed of the holographic material is available and therefore, a uniform hologram can be produced with a high reproducibility.

In addition to these advantages, the developing apparatus of the present invention effectively prevents a peeling off of the holographic layer from the substrate, since the developing chamber 10 has a closed structure and a dried air or nitrogen gas is introduced into the chamber 10. Note, in the prior art method, such a peeling off of the holographic layer was essentially due to a condensation of the included water, due to the vaporization of the solvents and subsequent cooling of the layer.

Although in this embodiment the container 11 for the swelling solution preferably has a barrier wall, the shape of the barrier wall is not restricted to the cylinder described above. Nevertheless, the cylinder is considered most preferable, and further preferably a height of the barrier, i.e., length from the level of the swelling solution to a top end of the barrier is $S^{\frac{1}{2}}$ or more, assuming that an area of the open top of the barrier is S.

The present invention will be further described with reference to the following examples.

EXAMPLE 1

Formation of Transmission Hologram

First, 7 g of polyvinyl carbazole having a weight average molecular weight ($\overline{M}w$) of 750,000 and 0.1 g of polycarbonate ($\overline{M}w=40,000$) were dissolved in 92 g of a mixed solution of tetrahydrofuran and monochlorobenzene (1:1), and 0.7 g of tetra(tert-butylproxycarbonyl)-benzophenone as a photosensitive agent and 0.14 g of thiopyrrium were added to the solution to prepare a coating solution. The coating solution was spun-coated on a glass substrate having a size of 150×150 mm to form a photsensitive layer having a thickness of 6 μm.

The photosensitive layer was interference exposed to a two-beam Ar laser (488 nm), each beam having an intensity of 0.5 mW/cm², for three minutes. The exposure amount was 80 mJ/cm², and a latent hologram of the spatial frequency of 2000 lines/mm was recorded.

Thereafter, the exposed layer was discolored with a mixed solution of xylene and isopropanol, to remove the used photosensitive agent therefrom, and the layer was dipped in a developer for 30 seconds after air drying and the dipped layer then slowly pulled up. The developer used in this example is a mixed solution of 75 parts by weight of a good solvent and 25 parts by weight of a poor solvent, and is summarized in Table 1. Namely, the developer of this example was prepared by combining a good solvent selected from three types of solvents and a poor solvent selected from six types of solvents (paraffin hydrocarbons).

TABLE 1

| solvent | boiling point (°C.) | evaporation heat (cal/g) |
| --- | --- | --- |
| (1) dichloromethane (good solvent) | 39.8 | 78.9 (at b.p.) |
| (2) tetrahydrofuran (good solvent) | 66 | 98.1 (at b.p.) |
| (3) 1,2-dichloroethane (good solvent) | 83.5 | 77.3 (at b.p.) |
| (4) pentane (poor solvent) | 36.1 | 92.6 (at 0° C.) |

TABLE 1-continued

| solvent | boiling point (°C.) | evaporation heat (cal/g) |
| --- | --- | --- |
| (5) hexane (poor solvent) | 68.7 | 91.8 (at 0° C.) |
| (6) heptane (poor solvent) | 98.4 | 90.6 (at 0° C.) |
| (7) octane (poor solvent) | 125.7 | 86.8 (at 25° C.) |
| (8) nonane (poor solvent) | 150.8 | 86.5 (at 25° C.) |
| (9) decane (poor solvent) | 174.1 | 86.3 (at 25° C.) |

The procedure of Example 1 was repeated by using different combinations of the good and poor solvents listed in Table 1, to ascertain the possible combinations useful in the single step development of the present invention. The results are summarized in Table 2.

TABLE 2

| good solvent | poor solvent | | | | | |
| --- | --- | --- | --- | --- | --- | --- |
| | 4 | 5 | 6 | 7 | 8 | 9 |
| 1 | x | Δ | ∘ | ∘ | ∘ | ∘ |
| 2 | x | x | x | ∘ | ∘ | — |
| 3 | x | x | x | ∘ | ∘ | — |

∘ ... good
Δ ... fair
x ... bad

The results of Table 2 show that the single step development is possible when a difference in the boiling points of the good and poor solvents (practically, ease of evaporation of the mixed solution) is increased, and that a small difference in the boiling points will not allow a such development to be conducted.

EXAMPLE 2

Formation of Transmission Hologram

First, 7 g of polyvinyl carbazole ($\overline{M}w=750,000$) and 0.1 g of polycarbonate ($\overline{M}w=40,000$) were dissolved in 92 g of a mixed solution of tetrahydrofuran and monochlorobenzene (1:1), and 0.7 of iodoform as a photosensitive agent and 0.14 g of tetraphenylnaphthacene were added to the solution to prepare a coating solution. The coating solution was spun-coated on a glass substrate having a size of 150×150 mm to form a photosensitive layer having a thickness of 6 μm.

A limited area (100×100 mm) of the photosensitive layer was interference exposed to a two-beam Ar laser (488 nm), each beam having an intensity of 0.5 mW/cm², for three minutes. The exposure amount was 80 mJ/cm², and a latent hologram of the spatial frequency of 1600 lines/mm was thus recorded.

Thereafter, the exposed layer was discolored with a mixed solution of xylene and isopropanol, to remove the used photosensitive agent therefrom, and the layer was dipped in a developer having a temperature adjusted to 20° C. for 30 seconds. The developer used was a mixed solution of 70% by weight of dichloromethane and 30% by weight of n-octane. The dipped layer was then pulled up at a speed of 2 mm/sec from the developer, in an atmosphere of dry nitrogen gas, and a hologram having a diffraction efficiency of 65±5% at 488 nm was obtained.

EXAMPLE 3

Formation of Reflection Hologram

The procedure of Example 2 was repeated with the proviso that the photsensitive layer had a thickness of 8 μm, both sides of the holographic material were exposed to an Ar laser (515 nm) to record a reflection type latent hologram, and the developer was a mixed solution of 68% by weight of dichloromethane, 20% by weight of octane, 5% by weight of xylene and 7% by weight of ethanol. A hologram having a diffraction efficiency of 70% at 515 nm was obtained.

EXAMPLE 4

Formation of Transmission Hologram

First, 100 part by weight of vinyl carbazole and 2 parts by weight of styrene were cationically polymerized to produce a vinylcarbazole-styrene compolymer having a weight average molecular weight of 700,000.

Using the resultant copolymer, the procedure of Example 2 was repeated, with the proviso that the developer was a mixed solution of 65% by weight of dichloromethane, 25% by weight of octane and 10% by weight of ethanol. A hologram having a diffraction efficiency of 75% at 488 nm was obtained.

EXAMPLE 5

Formation of Transmission Hologram

This example is intended to explain the formation of the transmission hologram by using the developing apparatus of FIG. 5.

First, 7 g of polyvinyl carbazole ($\overline{M}w = 750,000$) and 0.1 g of polycarbonate ($\overline{M}w = 40,000$) were dissolved in 92 g of the mixed solution of tetrahydrofuran and monochlorobenzene (1:1), and 0.7 g of iodoform as a photosensitive agent and 0.14 g of tetraphenylnaphthacene were added to the solution to prepare a coating solution. The coating solution was spun-coated on a glass substrate having a size of $150 \times 150$ mm to form a photosensitive layer having a thickness of 6 μm.

A limited area ($100 \times 100$ mm) of the photosensitive layer was interference exposed to a two-beam Ar laser (488 nm), each beam having an intensity of 0.5 mW/cm$^2$, for three minutes. The exposure amount was 80 mJ/cm$^2$, and a latent hologram having a spatial frequency of 1600 lines/mm was recorded.

Thereafter, the exposed layer was discolored by dipping in a mixed solution of 90% by weight of xylene and 10% by weight of isopropanol for five minutes, to remove the used photosensitive agent therefrom. The temperature of the mixed solution was 28° C. After completion of the discoloration, the discolored photosensitive layer removed from the mixed solution was dried in a flow of dried nitrogen gas, for one hour.

The exposed and discolored photosensitive layer or holographic material was set in the developing apparatus of FIG. 5, in which the container 11 had a barrier wall 28 as shown in FIG. 7, and immersed in a developer for 30 seconds. The developer was a mixed solution of 70% by weight of dichloromethane and 30% by weight of octane. The photosensitive layer was swollen, and the swollen photosensitive layer was then pulled up at a speed of 2 mm/sec from the developer. The guide means 17 was used for the pulling-up operation. A uniform hologram having a diffraction efficiency of 65±5% at 488 nm was obtained.

EXAMPLE 6

Formation of Transmission Hologram

The procedure of Example 5 was repeated, with the proviso that the barrier wall was removed from the container 11 as illustrated in FIG. 6. A comparable hologram having a diffraction efficiency similar to that of Example 5 was obtained, but it was observed that the hologram surface had a plurality of parallel lines in the pulling up direction, and a noise component of the diffracted light was increased.

EXAMPLE 7

This example is a comparative example.

The procedure of Example 5 was repeated, with the proviso that the swollen photosensitive layer was discontinuously pulled up from the developer in accordance with the following recurring pattern; five seconds pulling up at a speed of 2 mm/sec; five seconds stop; five seconds pulling up at a speed of 2 mm/sec; five seconds stop; . . . A poor hologram was obtained. Also, it was observed that the hologram surface had a plurality of remarkable stripes, at intervals of 1 cm, perpendicular to the pulling up direction, and the diffraction efficiency was increased or reduced in the range of 30 to 65% at the same pitches.

EXAMPLE 8

Formation of Reflection Hologram

A photosensitive solution having the following composition was prepared:

| | |
|---|---|
| Polyvinyl carbazole | 10 g |
| N-vinyl carbazole | 1.0 g |
| Iodoform | 0.5 g |
| Tetraphenylnaphthacene | 0.2 g |
| Polycarbonate | 0.2 g |
| Tetrahydrofuran | 100 g |

The photosensitive solution was spun-coated on a glass substrate having a size of $150 \times 150$ mm to form a photosensitive layer at a dry thickness of 10 μm.

A limited area ($120 \times 120$ mm) of the photosensitive layer was exposed to a two-beam Ar laser (488 nm), each beam having an intensity of 0.5 mW/cm$^2$, for one minute and at an exposure amount of 60 mJ/cm$^2$. The Ar laser was irradiated on both surfaces of the photosensitive layer to form a reflection type latent hologram.

After the exposure, the photosensitive layer was discolored with a mixed solution of xylene and isopropanol to remove the low molecular weight components therefrom, and dried in air. The discolored photosensitive layer was then immersed in a developer of dichloromethane:isopropanol:octane (7:1:2) for 30 seconds, and pulled up from the developer at a speed of 2 mm/sec. The developed hologram had no substantial distribution of the developer drops on a surface thereof, and further, did not essentially show a difference of the development strength in a longitudinal direction, but indicated a uniform and excellent development. A reflection diffraction efficiency in the overall hologram under the Bragg conditions was 95% or more.

EXAMPLE 9

Formation of Transmission Hologram

A photosensitive solution having the following composition was prepared:

| | |
|---|---|
| Polyvinylcarbazole | 10 g |
| Tris(acryloyloxyethyl)isocyanurate | 6.0 g |
| 4,4'-tetra(t-butylperoxycarbonyl)benzophenone | 1.0 g |
| Ketocoumarin 6 | 0.2 g |
| Polycarbonate | 0.2 g |

-continued

| Tetrahydrofuran | 100 g |

The photosensitive solution was spun-coated on a glass substrate having a size of 150×150 mm to form a photosensitive layer at a dry thickness of 6 μm.

A limited area (120×120 mm) of the photosensitive layer was exposed to a two-beam Ar laser (488 nm), each beam having an intensity of 0.5 mW/cm$^2$, for one minute and at an exposure amount of 10 mJ/cm$^2$. The Ar laser was irradiated on the same side of the photosensitive layer to form transmission type a latent hologram having a spatial frequency of 2000 lines/mm.

After exposure, the photosensitive layer was discolored with a mixed solution of xylene, isopropanol, acetone and monochlorobenzene to remove the low molecular weight components, and dried in air. The discolored photosensitive layer was immersed in a developer of dichloromethane:isopropanol:octane (71:9:20) for 30 seconds, and then pulled up from the developer at a speed of 2 mm/sec. The developed hologram had no substantial distribution of the developer drops on a surface thereof, and no substantial difference of the development strength in a longitudinal direction thereof, and showed an excellent uniformity. A diffraction efficiency in the overall hologram was 85% or more with regard to the He-Ne laser.

EXAMPLE 10

Formation of Reflection Hologram

A photosensitive solution having the following composition was prepared:

| Polyethylene chloride | 10 g |
| Pentaerythritol triacrylate | 5.0 g |
| Trichlorotriazine | 1.0 g |
| Ketocoumarin | 0.2 g |
| Polyvinyl chloride | 0.2 g |
| Tetrahydrofuran | 100 g |

The photosensitive solution was spun-coated on a glass substrate having a size of 150×150 mm to form a photosensitive layer at a dry thickness of 6 μm.

A limited area (120×120 mm) of the photosensitive layer was exposed to a two-beam Ar laser (488 nm), each beam having an intensity of 0.5 mW/cm$^2$, for one minute and at an exposure amount of 20 mJ/cm$^2$. The Ar laser was irradiated on both surfaces of the photosensitive layer to form a reflection type latent hologram.

After exposure, the photosensitive layer was discolored with a mixed solution of xylene and tetrahydrofuran to remove the low molecular weight components therefrom, and dried in air. The discolored photosensitive layer was immersed in a developer of tetrahydrofuran:acetoalcohol:nonane (6:3:1) for 30 seconds, and then pulled up from the developer at a speed of 1 mm/sec. The developed hologram had no substantial distribution of the developer drops on a surface thereof and no substantial difference of the development strength in a longitudinal direction thereof, and it showed an excellent uniformity. A diffraction efficiency in the overall hologram was 70% or more.

EXAMPLE 11

Formation of Reflection Hologram

A photosensitive solution having the following composition was prepared:

| Polyvinyl butyral | 30 g |
| Acrylamide | 9.0 g |
| N-methylacrylamide | 1.0 g |
| N,N'-methylenebisacrylamide | 1.0 g |
| Methylene blue | 0.002 g |
| Triethanolamine | 0.5 g |
| Ethanol | 100 g |

The photosensitive solution was spun-coated on a glass substrate having size of 150×150 mm to form a photosensitive layer at a dry thickness of 10 μm.

A limited area (120×120 mm) of the photosensitive layer was exposed to a two-beam He-Ne laser (632.8 nm), each beam having an intensity of 0.5 mW/cm$^2$, for one minutes and at an exposure amount of 50 mJ/cm$^2$. The He-Ne laser was irradiated on both surfaces of the photosensitive layer to form a reflection type latent hologram.

After exposure, the photosensitive layer was discolored with an aqueous solution of methanol to remove the low molecular weight components therefrom, and dried in air. The discolored photosensitive layer was immersed in a developer of tetrahydrofuran:methanol:nonane (4:3:3) for 30 seconds, and then pulled up from the developer at a speed of 1 mm/sec. The developed hologram showed little distribution of the developer drops on a surface thereof, but no difference of the development strength in a longitudinal direction thereof.

EXAMPLE 12

Formation of Reflection Hologram

A photosensitive solution having the following composition was prepared:

| Polyvinyl pyrrolidone | 10 g |
| Pentaerythritol triacetate | 5.0 g |
| Arene-ferric complex | 0.3 g |
| Polyvinyl alcohol | 0.2 g |
| Water | 100 g |

The photosensitive solution was spun-coated on a glass substrate having a size of 150×150 mm to form a photosensitive layer at a dry thickness of 10 μm.

A limited area (120×120 mm) of the photosensitive layer was exposed to a two-beam Ar laser (488 nm), each beam having an intensity of 0.5 mW/cm$^2$, for one minute and at an exposure amount of 50 mJ/cm$^2$. The Ar laser was irradiated on both surfaces of the photosensitive layer to form a reflection type latent hologram.

After exposure, the photosensitive layer was discolored with a mixture of water and ethanol to remove the low molecular weight components therefrom, and dried in air. The discolored photosensitive layer was immersed in a developer of water and diacetone alcohol (60:40) at 70° C. for 30 seconds, and then pulled up from the developer, at a speed of 2 mm/sec, while blowing hot air on to the layer surface to cause a rapid evaporation of water. The developed hologram show little distribution of the developer drops, but no difference of the development strength in a longitudinal direction thereof. A diffraction efficiency in the overall hologram was 85% or more.

We claim:

1. An apparatus for forming a volume type phase hologram, provided with a developing apparatus comprising:
   a developing chamber having a closed wall,
   a container for a swelling solution disposed in a bottom wall of said chamber,
   a means for maintaining said swelling solution at a predetermined and constant temperature,
   a means for fixing an exposed holographic material to be developed, and
   a guide means for moving said holographic material to be dipped in said swelling solution and then pulling the developed holographic material up from said swelling solution at a predetermined speed, said guide means having said fixing means attached thereto.

2. An apparatus according to claim 1, in which said container has a jacket through which a heated or cooled water is circulated.

3. An apparatus according to claim 1, in which said guide means comprises a stand having a rack surface, a guide box movable upward and downward on said rack surface, and an arm mounted on said guide box, an end portion of said arm being connected with said means for fixing the holographic material.

4. An apparatus according to claim 1, in which said developing chamber has a gas or air inlet pipe and an exhaust pipe so that a dry atmosphere is created in the chamber.

5. An apparatus according to claim 1, in which said container has a barrier wall in an upper end portion thereof so that, at an initial stage of pulling up, the pulled up holographic material is protected from direct exposure to the flowing atmosphere.

6. An apparatus according to claim 1, in which said holographic material comprises a polymeric matrix having a radiation active substance associated therewith to an interference pattern of radiation to form a latent image of a hologram and said swelling solution consists of a first solvent which can act as a good solvent for the polymer of said matrix and a second solvent which can act as a poor solvent for said polymer and has a higher boiling point than that of said first solvent.

* * * * *